United States Patent
Kwong et al.

(10) Patent No.: US 6,497,578 B1
(45) Date of Patent: Dec. 24, 2002

(54) METHOD AND APPARATUS TO INCREASE CABLE CONNECTOR DENSITY IN EQUIPMENT

(75) Inventors: Herman Kwong, Kanata (CA); Ronald R. Wellard, Kanata (CA); Leslie J. Crane, Kinburn (CA); Stephen Dragan, Orleans (CA); Dieter D. Mueller, Almonte (CA); Greg J. Clouston, Stittsville (CA)

(73) Assignee: Nortel Networks Limited, Quebec (CA)

( * ) Notice: Subject to any disclaimer, the term of this patent is extended or adjusted under 35 U.S.C. 154(b) by 0 days.

(21) Appl. No.: 09/829,978

(22) Filed: Apr. 11, 2001

(51) Int. Cl.$^7$ .................................................. H01R 9/09
(52) U.S. Cl. ........................................ 439/61; 439/954
(58) Field of Search .............................. 439/61, 66, 77, 439/67; 361/749, 788, 789

(56) References Cited

U.S. PATENT DOCUMENTS

| | | | | |
|---|---|---|---|---|
| 4,781,601 A | * | 11/1988 | Kuhl et al. | 361/749 |
| 5,129,848 A | * | 7/1992 | Etheridge et al. | 441/2 |
| 5,224,023 A | * | 6/1993 | Smith et al. | 174/254 |
| 5,276,590 A | * | 1/1994 | Budman et al. | 174/250 |
| 5,376,011 A | * | 12/1994 | Rudy et al. | 439/248 |

* cited by examiner

Primary Examiner—Lynn D. Feild
Assistant Examiner—Phoung KT Dinh
(74) Attorney, Agent, or Firm—Hunton & Williams

(57) ABSTRACT

A cable card having increased cable connector density is provided. The cable card has a non-planar surface and, therefore, more surface area than a planar cable card having the same outside dimensions. The increased surface area of the non-planar surface permits more connectors of a given size to be located on the cable card.

36 Claims, 6 Drawing Sheets

METHOD AND APPARATUS TO INCREASE CABLE CONNECTOR DENSITY IN EQUIPMENT

FIELD OF THE INVENTION

The present invention is generally related to the field of equipment connection. More particularly, the present invention is related to increasing connector density in equipment.

BACKGROUND OF THE INVENTION

In the highly competitive area of electronic equipment, there is ever present pressure to provide more equipment in a smaller space. The problem is compounded by the high cost of electronic equipment and the associated reluctance on the part of the equipment owner to frequently replace this expensive equipment. When equipment changes are unavoidable, the cost of such changes can be greatly reduced if the cables and connectors used with the existing equipment can be reused. However, the physical size of connectors is often a limiting factor in condensing more equipment into a limited space.

FIGS. 1 and 2 are a front view and a top view, respectively, of an example of equipment in the related art. The example shown in FIGS. 1 and 2 is a piece of computer network equipment having a frame 105 connected to a backpanel 110. Network cards 130 are removably attached to the backpanel 110 and cables 140 are removably attached to backpanel 110 by connectors 120. Cables 140 lead to various other pieces of equipment on the network.

SUMMARY OF THE INVENTION

In accordance with the present invention, the above problems are solved by increasing the density of cable connectors attachable to a piece of equipment of a given size. Increasing the number of cable connectors attachable to a piece of equipment of a given size, while maintaining the size of the connectors, increases the capacity of the equipment without increasing the space required by the equipment or requiring expensive and time consuming recabling.

In accordance with the present invention, cable connector density is increased by providing a non-planar cable card to which the cable connectors are attached. A non-planar cable card having, for example, a zig-zag profile provides more surface area than a planar cable card having the same length and width. The increased surface area of the non-planar cable card provides more area for the placement of cable connectors. Therefore, for a given cable connector size, a non-planar cable card can accommodate more connectors than a planar cable card having the same length and width.

The invention permits a new cable card to be fabricated to fit existing equipment and provide an increased number of cable connectors of the same size as the existing equipment. As a result, the connectors on the existing cables need not be changed, avoiding expensive cable modifications and testing.

BRIEF DESCRIPTION OF THE DRAWING FIGURES

The invention will be more fully understood from the following Detailed Description of Preferred Embodiments and the following drawing figures, which should not be construed as limiting, but are intended to be exemplary only, and of which:

DETAILED DESCRIPTION OF PREFERRED EMBODIMENTS

The invention is not limited to the particular structures disclosed herein. Rather, as a natural consequence of reading this specification, other connector device executions within the purview of the present invention will become readily apparent to those skilled in the art of connector devices.

Figure 1:
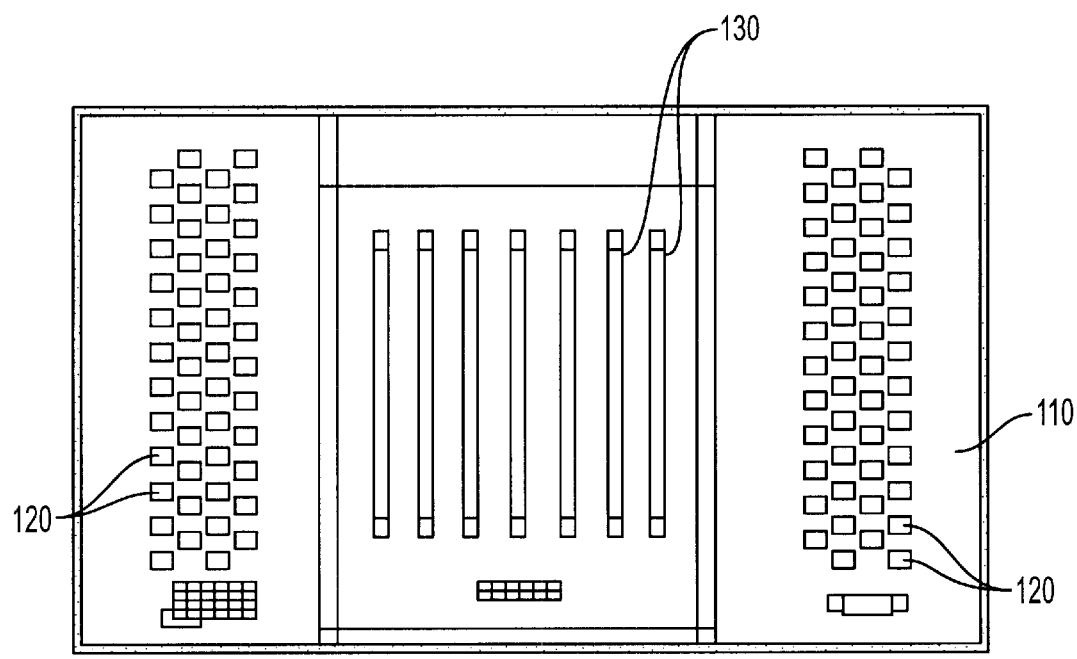
FIG. 1 is a front view of an example of related equipment.
Figure 2:
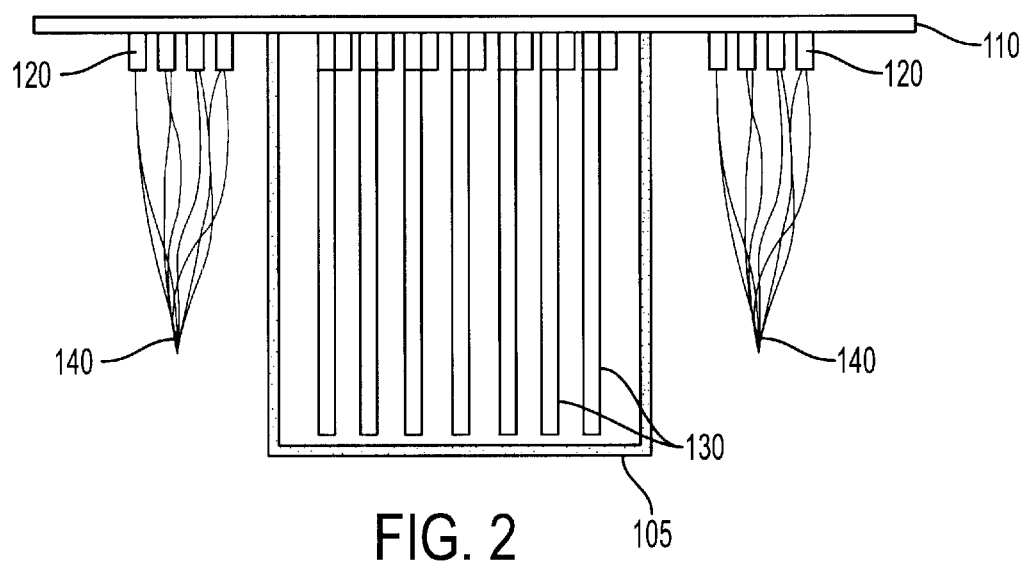
FIG. 2 is a top view of the equipment shown in FIG. 1.
Figure 3:
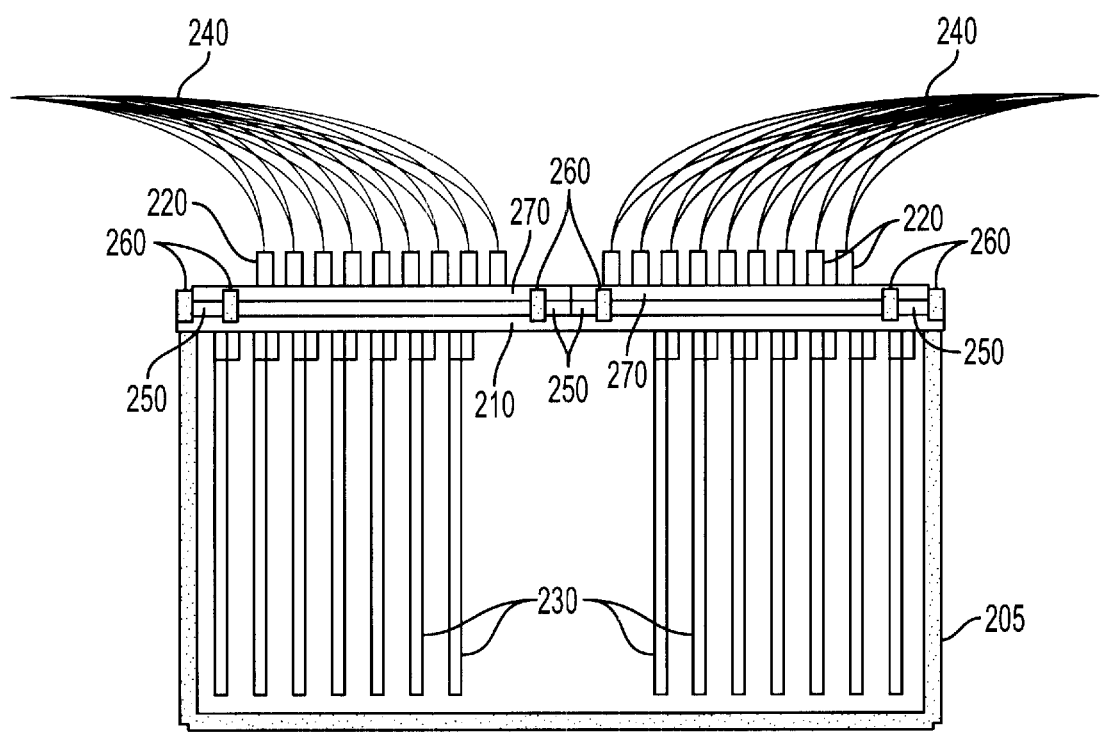
FIG. 3 is top view of equipment using a planar cable card.

FIG. 3 shows a piece of network equipment having a frame 205 to which a backpanel 210 is attached. A plurality of network cards 230 are removably attached to backpanel 210. Network cards 230 are, for example, printed circuit boards containing electronic devices used to provide functionality of the network. Attached to backpanel 210 are two cable cards 270. Although two cable cards 270 are shown in this example, a single cable card or more than two cable cards could be used. Cable cards 270 are electrically connected to network cards 230 by connector fields 250. Electromagnetic Control (EMC) devices 260 surround connector fields 250 to contain any electromagnetic field produced by connector field 250. Cable cards 270 have a plurality of connectors 220 by which cables 240 are connected to cable cards 270.

Figure 4:
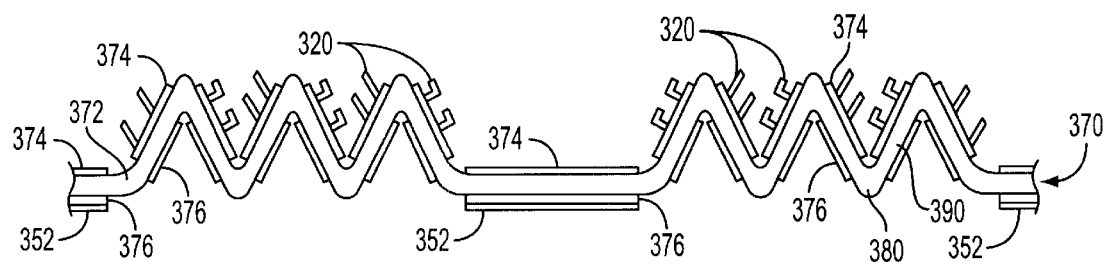
FIG. 4 is a top view of a cable card of a first embodiment of the invention.
Figure 5:
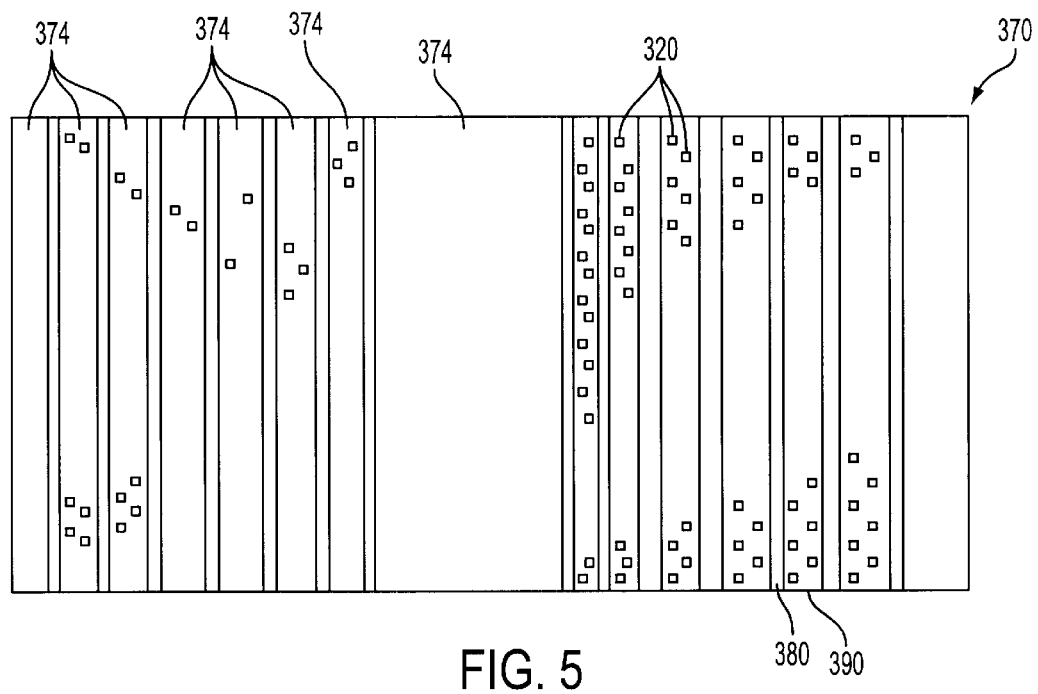
FIG. 5 is a front view of the cable card shown in FIG. 4.

FIGS. 4 and 5 are a top view and a front view, respectively, of a cable card 370 in accordance with a first embodiment of the invention. In this embodiment, cable card 370 is made of a flexible layer 372 which is preferably a flexible printed circuit board material such as, for example, Kapton by Dupont. Certain portions of cable card 370 are made rigid by sandwiching flexible layer 372 between an upper rigid layer 374 and a lower rigid layer 376. As shown in FIG. 4, by selectively locating upper rigid layer 374 and lower rigid layer 376, alternating flexible sections such as flexible section 380 and rigid sections such as rigid section 390 are formed. As a result, cable card 370 can be bent as shown in FIG. 4 such that it has a zig-zag profile. Connectors 320 are located on particular portions of upper rigid layer 374 for connection to cables leading to, in this example, other components of a network. While connectors 320 are shown only on upper rigid layer 374 in this example, it is noted that connectors 320 can also be located on flexible layer 372. In addition, the locations of connectors 320 shown in FIGS. 4 and 5 are only one example of possible connector locations. It is noted that a maximum number of connectors 320 is preferable. Connector fields 352 are provided for connection to connector fields such as connector fields 250 on backpanel 210 shown in FIG. 3. Electrical connection between connectors 320 and connector fields 352 are made through the printed circuits of flexible layer 372.

Figure 6:
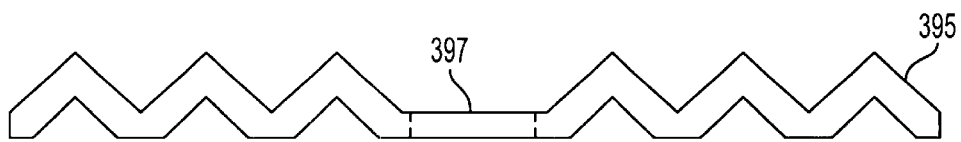
FIG. 6 is a top view of an example of a support frame for the cable card shown in FIG. 4.
Figure 7:
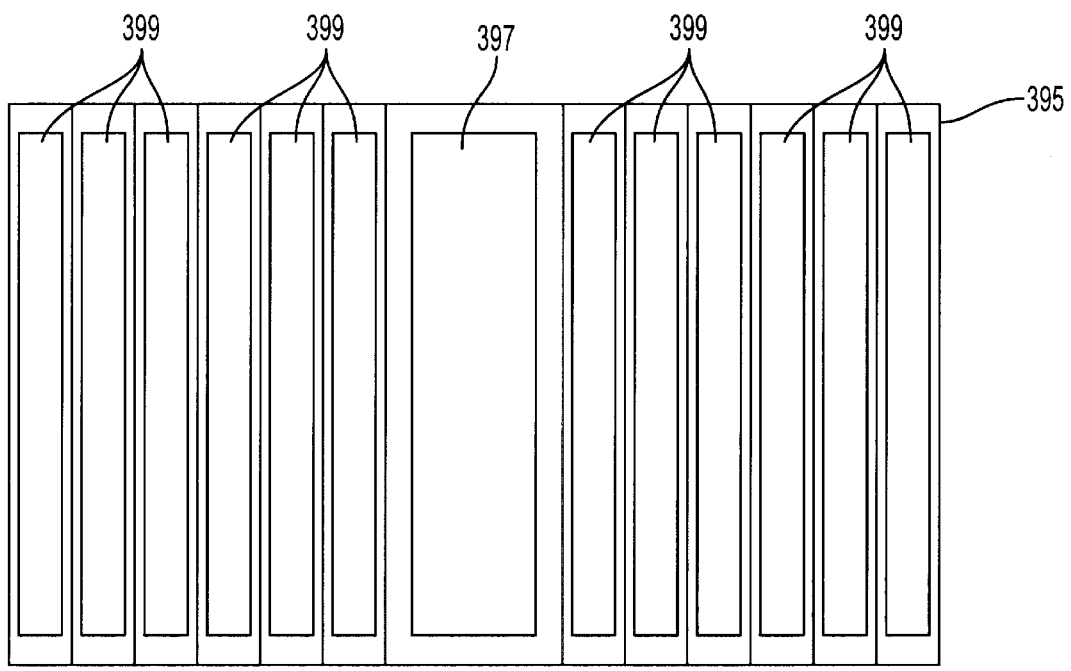
FIG. 7 is a front view of the support frame shown in FIG. 6.

Due to the flexible nature of cable card 370 and the mechanical stresses it is subjected to due to the weight of cables and connectors connected it, it is preferable to provide some sort of mechanical support for cable card 370. FIGS. 6 and 7 show an example of a support frame 395 that can be used to support cable card 370. Support frame 395 is shown with a passage way 397 to enable connector field 352 to mate with a connector field on the equipment and slots 399 to accommodate connector pins which are soldered onto the cable card 370 by through hole technology. Support frame 395 can be made of cast iron, zinc die cast, structural plastic or any other sufficiently strong and rigid material. Although support frame 395 is shown as continuous from top to bottom in FIG. 7 such that it would support essentially the entire area of cable card 370, a support frame could be provided that supports only the perimeter or any other portion of cable card 370 as long as cable card 370 is sufficiently supported.

Figure 8:
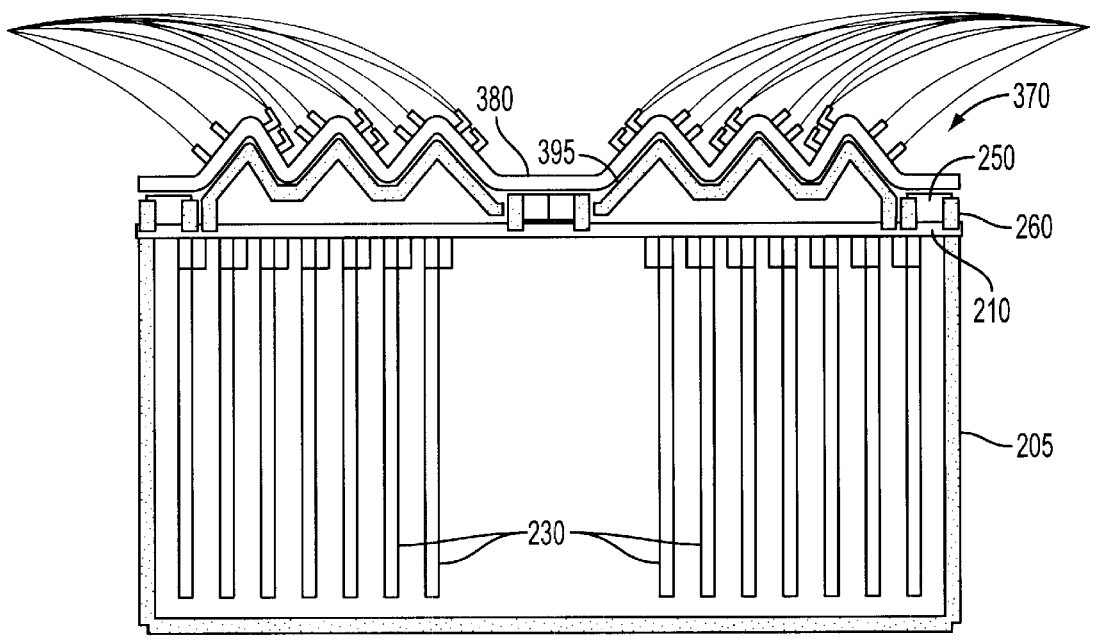
FIG. 8 is a top view of an embodiment of the invention incorporating the cable card of FIGS. 4 and 5 and the support frame of FIGS. 6 and 7.

FIG. 8 shows a piece of network equipment similar to that shown in FIG. 3 but equipped with cable card 370 and support frame 395. In the interest of clarity, upper rigid layer 374, lower rigid layer 376 and connector fields 352 are not shown in FIG. 8.

The angle at which cable card 370 is bent at flexible sections 380 determines the increase in surface area obtained by the invention. For example, if cable card 370 is bent at 45° relative to horizontal, an increase of approximately 40% in board area is realized (2 Sin 45°=1.4). Other angles can also be used depending on connector size and shape.

Figure 9:
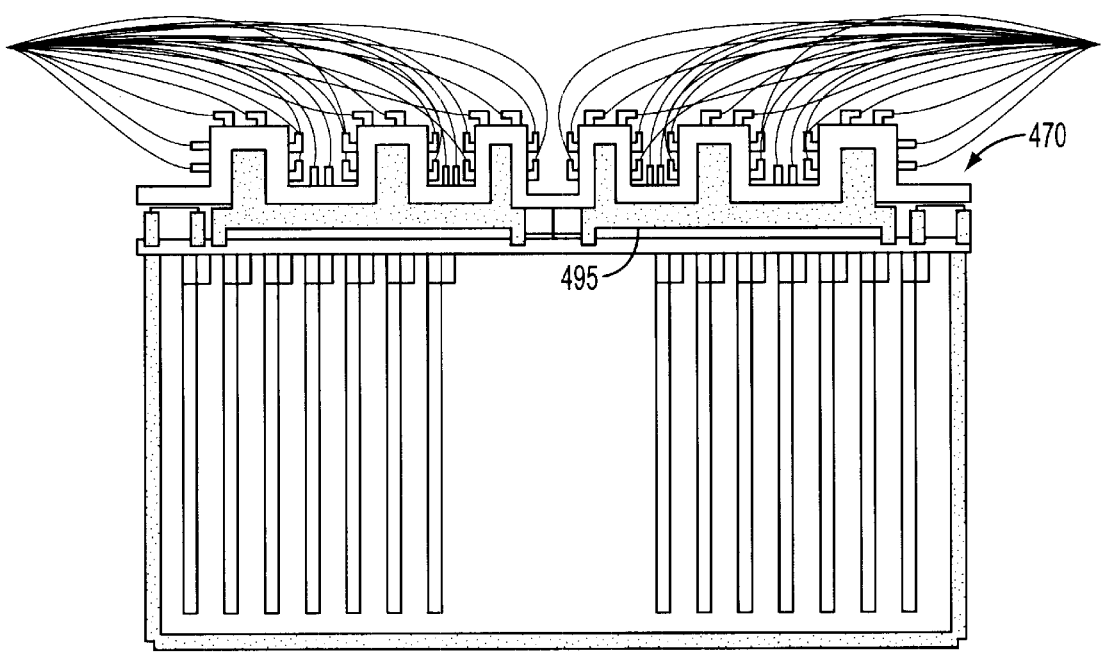
FIG. 9 is a top view of a second embodiment of the invention.
Figure 10:
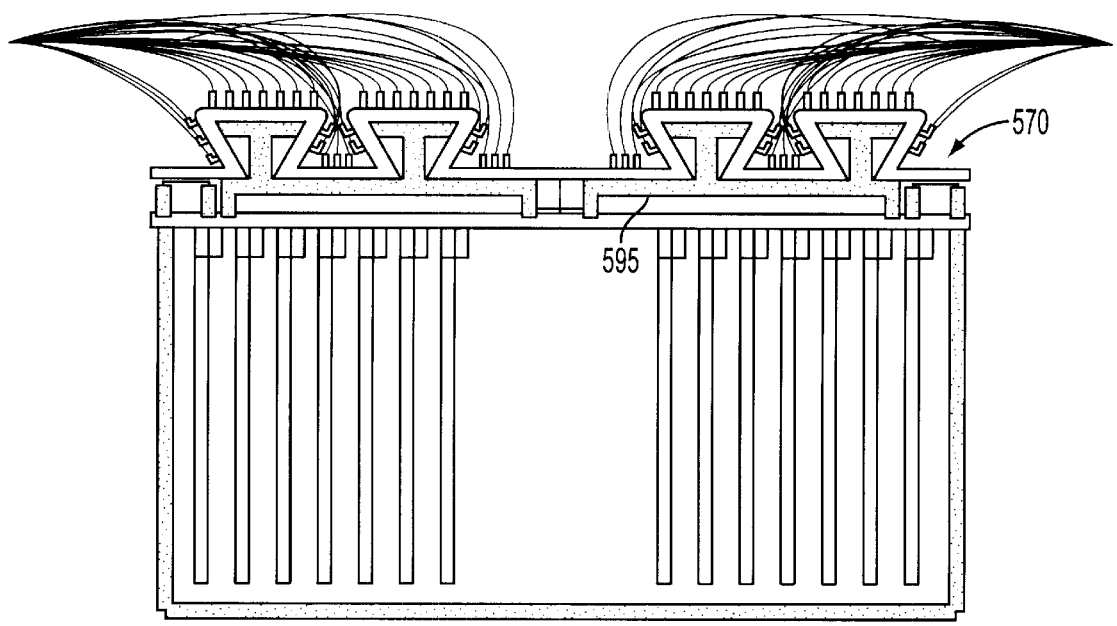
FIG. 10 is a top view of third embodiment of the invention.
Figure 11:
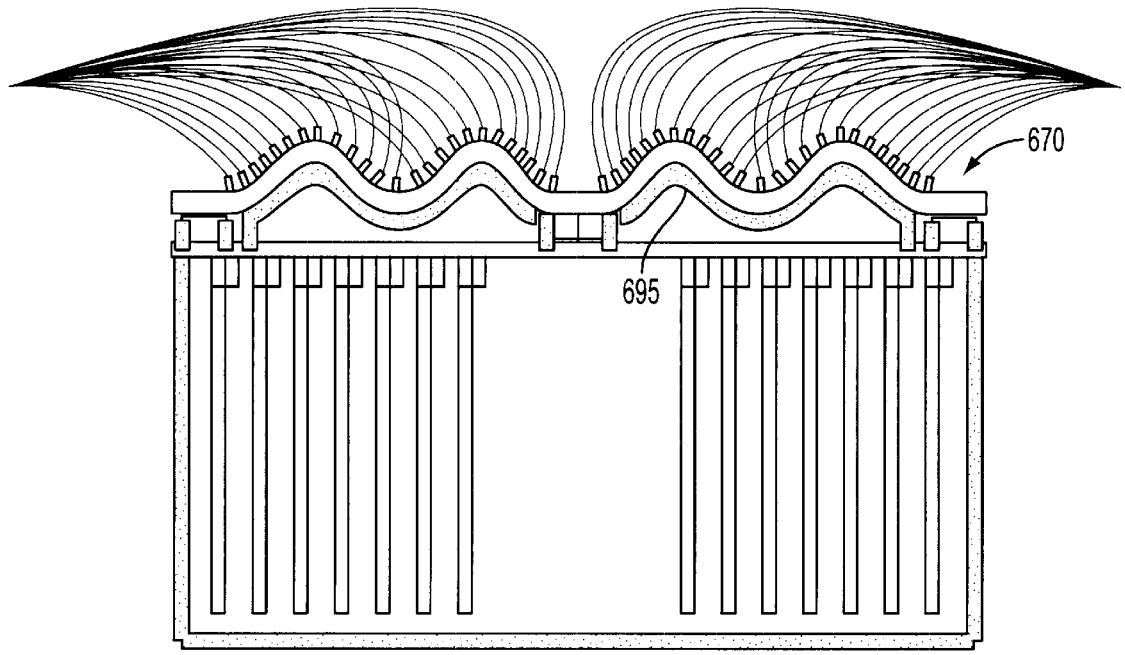
FIG. 11 is a top view of a fourth embodiment of the invention.

FIGS. 9–11 show other embodiments of the invention. The embodiments shown in FIGS. 9 and 10 have alternating flexible sections and rigid sections similar to the embodiment shown in FIGS. 4–8. FIG. 9 shows a cable card 470 having a square, or notch, profile and an appropriate support frame 495. FIG. 10 shows a cable card 570 having a dove tail profile and an appropriate support frame 595. The embodiment shown in FIGS. 9 and 10 provide even more surface area on the cable card than does the embodiment shown in FIG. 8. However, the embodiments shown in FIGS. 9 and 10 may be limited to use with connectors of only certain sizes and shapes due to the relatively small recesses created by their shapes.

FIGS. 8–10 are merely 3 examples of embodiments of the invention having angular surfaces. It is noted that any combination of the shapes of these embodiments is also contemplated as part of the invention. For example, the 90° inside corners or the 90° outside corners of the embodiment shown in FIG. 9 could be replaced with surfaces that are 45° to the horizontal. Similar modifications could be made to the embodiment shown in FIG. 10, if desirable.

FIG. 11 shows a cable card 670 and a support frame 695 having a wave profile. In this embodiment, cable card 670 may not include a rigid layer or it may include a rigid layer preformed to the wave profile.

While the invention has been described in detail, with reference to FIG. 4, as having upper rigid layer 374 and lower rigid layer 375 sandwiching flexible layer 372, it is noted that this is just one example of the possible configurations. As alternatives, the cable card can use no rigid layers, a single or multiple rigid layers within the flexible layer, single or multiple rigid layers either above and/or below the flexible layer, multiple flexible layers or any combination thereof.

Depending on the configuration of the cable card, the cables connected to the cable card may be connected before or after the cable card is connected to the support frame. Due to the configuration of the cable card, it may be necessary to connect the cables to the cable card prior to the cable card being bent into its final shape and connected to the support frame. In other embodiments, the cable card will be mounted to the support frame and attached to the equipment prior to the cables being connected to the cable card.

The invention has been described in connection with preferred embodiments. These embodiments are intended to be illustrative only. Variations, modifications and different applications of the invention taught in the Detailed Description and drawings will be apparent to those skilled in the art. Accordingly, it should be understood that other embodiments of the invention might be practiced without departing from the spirit and scope of the invention as defined by the appended claims.

What is claimed is:

1. A cable card for attaching to a backpanel, the cable card comprising:
    at least one layer including at least one printed circuit layer;
    a plurality of connector locations for facilitating electrical connections to the at least one printed circuit layer; and
    a support frame for attaching to the backpanel, the support frame supporting the at least one layer such that the at least one layer is non-planar when supported by the support frame, thereby providing the at least one layer with an increased non-planar surface area for accommodating an increased number of cable connections that would not have been possible if made directly to the backpanel.

2. The card of claim 1, wherein the at least one layer has alternating rigid and flexible sections such that the at least one layer has a non-linear profile when the at least one layer is bent at the flexible sections.

3. The card of claim 2, wherein the at least one layer comprises:
    a flexible layer; and
    a first rigid layer bonded to the flexible layer at the rigid sections of the at least one layer.

4. The card of claim 3, wherein the at least one layer further comprises:
    a second rigid layer bonded to the flexible layer at the rigid sections of the at least one layer such that the flexible layer is sandwiched between the first and second rigid layers at the rigid sections of the at least one layer.

5. The card of claim 2, wherein the at least one layer has a substantially zig-zag profile when supported by the support frame.

6. The card of claim 5, wherein a portion of the support frame has a substantially zig-zag profile that supports the substantially zig-zag profile of the at least one layer.

7. The card of claim 2, wherein the at least one layer has a substantially notch profile when supported by the support frame.

8. The card of claim 7, wherein a portion of the support frame has a substantially notch profile that supports the substantially notch profile of the at least one layer.

9. The card of claim 2, wherein the at least one layer has a substantially dovetail profile when supported by the support frame.

10. The card of claim 9, wherein a portion of the support frame has a substantially T-shaped profile that supports the substantially dovetail profile of the at least one layer.

11. The card of claim 1, wherein the at least one layer has a flexible section such that the at least one layer has a curved profile when the at least one layer is bent at the flexible section.

12. The card of claim 11, wherein the at least one layer has a substantially wave profile when supported by the support frame.

13. The card of claim 12, wherein a portion of the support frame has a substantially wave profile that supports the substantially wave profile of the at least one layer.

14. The card of claim 3, wherein the first rigid layer is incorporated into the flexible layer such that the flexible layer envelopes the first rigid layer.

15. A cable card for attaching to a backpanel, the cable card comprising:
at least one layer including at least one printed circuit layer;
a plurality of connector locations for facilitating electrical connections to the at least one printed circuit layer; and
a support frame for attaching to the backpanel and supporting the at least one layer such that the at least one layer is non-planar when supported by the support frame,
thereby providing the at least one layer with an increased non-planar surface area for accommodating an increased number of cable connections that would otherwise have been directly to the back panel.

16. The card of claim 15, wherein the at least one layer includes at least one printed circuit layer.

17. Electrical equipment comprising:
a backpanel;
a plurality of electronic device cards attached to the backpanel; and
a cable card comprising:
at least one layer including at least one printed circuit layer;
a plurality of connector locations for facilitating electrical connections to the at least one printed circuit layer, and
a support frame attached to the backpanel, the support frame supporting the at least one layer such that the at least one layer is non-planar when supported by the support frame,
thereby providing the at least one layer with an increased non-planar surface area for accommodating an increased number of cable connections that would not have been possible if made directly to the backpanel.

18. The equipment of claim 17, wherein the at least one layer has alternating rigid and flexible sections such that the at least one layer has a non-linear profile when the at least one layer is bent at the flexible sections.

19. The equipment of claim 18, wherein the at least one layer comprises:
a flexible layer; and
a first rigid layer bonded to the flexible layer at the rigid sections of the at least one layer.

20. The equipment of claim 19, wherein the at least one layer has a substantially zig-zag profile when supported by the support frame.

21. The equipment of claim 20, wherein a portion of the support frame has a substantially zig-zag profile that supports the substantially zig-zag profile of the at least one layer.

22. Electrical equipment comprising:
a backpanel;
a plurality of electronic device cards attached to the backpanel; and
a cable card comprising:
at least one layer including at least one printed circuit layer;
a plurality of connector locations for facilitating electrical connections to the at least one printed circuit layer; and
a support frame attached to the backpanel and supporting the at least one layer such that the at least one layer is non-planar when supported by the support frame,
thereby providing the at least one layer with an increased non-planar surface area for accommodating an increased number of cable connections that would otherwise have been directly to the backpanel.

23. The equipment of claim 22, wherein the at least one layer includes at least one printed circuit layer.

24. A method for increasing the connector capacity of electronic equipment having a backpanel, the method comprising:
providing a cable card comprising at least one layer, a plurality of connector locations, and a support frame, the at least one layer including at least one printed circuit layer, the plurality of connector locations for facilitating electrical connections to the at least one printed circuit layer, the support frame for attaching to the backpanel and supporting the at least one layer such that the at least one layer is non-planar when supported by the support frame, thereby providing the at least one layer with an increased non-planar surface area for accommodating an increased number of cable connections that would not have been possible if made directly to the backpanel; and
attaching the cable card to the backpanel via the support frame.

25. The method of claim 24, wherein the at least one layer has alternating rigid and flexible sections such that the at least one layer has a non-linear profile when the at least one layer is bent at the flexible sections.

26. The method of claim 25, wherein the at least one layer comprises;
a flexible layer; and
a first rigid layer bonded to the flexible layer at the rigid sections of the at least one layer.

27. The method of claim 25, wherein the at least one layer has a substantially zig-zag profile when supported by the support frame.

28. The method of claim 27, wherein a portion of the support frame has a substantially zig-zag profile that supports the substantially zig-zag profile of the at least one layer.

29. The method of claim 25, wherein the at least one layer has a substantially notch profile when supported by the support frame.

30. The method of claim 29, wherein a portion of the support frame has a substantially notch profile that supports the substantially notch profile of the at least one layer.

31. The method of claim 25, wherein the at least one layer has a substantially dovetail profile when supported by the support frame.

32. The method of claim 31, wherein a portion of the support frame has a substantially T-shaped profile that supports the substantially dovetail profile of the at least one layer.

33. The method of claim 24, wherein the at least one layer has a flexible section such that the at least one layer has a curved profile when the at least one layer is bent at the flexible section.

34. The method of claim 33, wherein the at least one layer has a substantially wave profile when supported by the support frame.

35. The method of claim 34 wherein a portion of the support frame has a substantially wave profile that supports the substantially wave profile of the at least one layer.

36. The method of claim 26, wherein the first rigid layer is incorporated into the flexible layer such that the flexible layer envelopes the first rigid layer.

* * * * *